United States Patent
Linzer et al.

(10) Patent No.: US 7,190,413 B2
(45) Date of Patent: Mar. 13, 2007

(54) MEMORY VIDEO DATA STORAGE STRUCTURE OPTIMIZED FOR SMALL 2-D DATA TRANSFER

(75) Inventors: Elliot N. Linzer, Suffern, NY (US); Ho-Ming Leung, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 539 days.

(21) Appl. No.: 10/306,749

(22) Filed: Nov. 27, 2002

(65) Prior Publication Data

US 2004/0100577 A1 May 27, 2004

(51) Int. Cl.
*H04N 9/64* (2006.01)
*G11C 8/00* (2006.01)

(52) U.S. Cl. .................. 348/716; 345/547; 365/230.04

(58) Field of Classification Search ................ 348/395, 348/398, 400, 403, 412, 415, 420, 421, 714–719; 382/232, 236, 238, 239; 375/240.24; 345/545–551, 345/531, 560; 365/230.3, 230.4
See application file for complete search history.

(56) References Cited

U.S. PATENT DOCUMENTS

| | | | |
|---|---|---|---|
| 4,821,119 A * | 4/1989 | Gharavi | 375/240.16 |
| 4,862,264 A * | 8/1989 | Wells et al. | 375/240.16 |
| 5,717,441 A | 2/1998 | Serizawa et al. | |
| 5,835,952 A | 11/1998 | Yamauchi et al. | |
| 5,900,865 A | 5/1999 | Howe | |
| 5,903,669 A * | 5/1999 | Hirabayashi | 382/232 |
| 6,069,976 A * | 5/2000 | Kim | 382/239 |
| 6,104,416 A | 8/2000 | McGuinness | |
| 2002/0109693 A1 | 8/2002 | Champion et al. | 345/536 |
| 2002/0109696 A1 | 8/2002 | Champion et al. | |

OTHER PUBLICATIONS

"H.264/MPEG-4 AVC Video Compression Tutorial", VIDEOLOCUS, 2002, 7 pages.
"Recent Advances in Video Compression Standards", By Guy Cote and Lowell Winger, IEEE Canadian Review, Spring /Printemps 2002, pp. 21-24.

* cited by examiner

*Primary Examiner*—Michael H. Lee
(74) *Attorney, Agent, or Firm*—Christopher P. Maiorana, P.C.

(57) ABSTRACT

An apparatus and method for storing image data comprising a first storage device and a second storage device. The first storage device may be configured to store at least one first pixel from a first field of a frame of the image at a first physical address in the first storage device. The second storage device may be configured to store a second pixel from a second field of the frame of the image at a second physical address in the second storage device. The first and second physical addresses may have the same relative position in an address space of the respective storage devices.

20 Claims, 6 Drawing Sheets

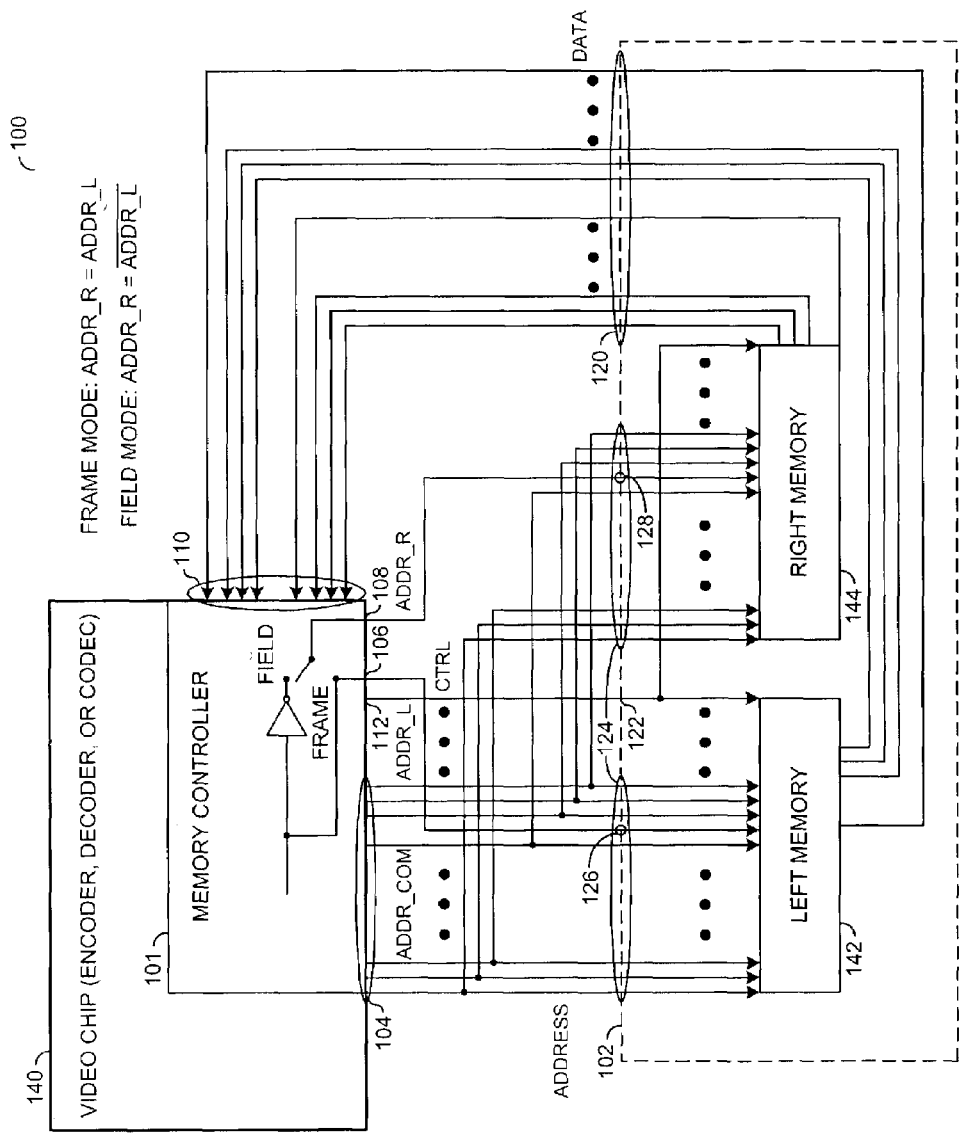

| 0 | 1 | 0 | 1 | 0 | 1 | 0 | 1 |
|---|---|---|---|---|---|---|---|
| 2 | 3 | 2 | 3 | 2 | 3 | 2 | 3 |
| 0 | 1 | 0 | 1 | 0 | 1 | 0 | 1 |
| 2 | 3 | 2 | 3 | 2 | 3 | 2 | 3 |

ASSIGNMENT OF BANKS TO TILES FOR LUMA WITH 8 BANKS TOTAL

FIG. 7A

| 0 | 1 | 0 | 1 | 0 | 1 | 0 | 1 |
|---|---|---|---|---|---|---|---|
| 1 | 0 | 1 | 0 | 1 | 0 | 1 | 0 |
| 0 | 1 | 0 | 1 | 0 | 1 | 0 | 1 |
| 1 | 0 | 1 | 0 | 1 | 0 | 1 | 0 |

ASSIGNMENT OF BANKS TO TILES FOR LUMA
WHEN ONLY FOUR BANKS TOTAL ARE USED

FIG. 7B

MEMORY VIDEO DATA STORAGE STRUCTURE OPTIMIZED FOR SMALL 2-D DATA TRANSFER

CROSS REFERENCE TO RELATED APPLICATION

The present application may relate to co-pending application Ser. No. 10/306,751, filed Nov. 27, 2002, which is hereby incorporated by reference in its entirety.

FIELD OF THE INVENTION

The present invention relates to a data storage device generally and, more particularly, to a memory video data storage structure optimized for small 2-D data transfers.

BACKGROUND OF THE INVENTION

Referring to FIG. 1, an image 40 illustrating a conventional raster approach to a video data storage structure is shown. A 1920 pixels wide by 1080 pixels high image can be stored as 1080 rows of 1920 bytes. A memory page size is 1024 bytes. Therefore, the rows of the image 40 are spread over a number of pages. One conventional approach to storing the image 40 is to store all of the bytes of the first row (i.e., ROW0) followed by the bytes of each subsequent row (i.e., ROW1, ROW2, etc.). When the image is processed (i.e., compressed), 9×9 blocks of the image 40 are operated upon. When loading a 9×9 block stored in the raster format, at least 9, and possibly ten, pages are retrieved.

Referring to FIG. 2, a block diagram of an image 50 illustrating another conventional storage approach. The image 50 is divided into a number of 32×32 pixel tiles 52a–52n. Each of the tiles 52a–52n is stored contiguously as one 1024 byte page. The number of pages transferred per 9×9 block is reduced when compared with the raster storage method of FIG. 1.

Referring to FIG. 3, a block diagram of a motion compensation block 60 is shown. The data within each of the tiles is stored in a raster format. By storing an image as tiles, a 9×9 block (or any size block up to 32×32) 60 can be transferred retrieving at most 4 pages. In the conventional approach, an interlaced image has each field stored separately.

It would be desirable to implement a method and/or architecture for overlapping pre-charge time and transfer time in a memory for video data storage. It would also be desirable to have a memory (e.g., SDRAM) architecture that may be used for video data storage applications that may (i) provide high bandwidth for short, random bursts as well as long, continuous, consecutive bursts, (ii) use less power than conventional approaches, (iii) provide a low cost solution, and/or (iv) be implemented with fewer pins than conventional solutions.

SUMMARY OF THE INVENTION

The present invention concerns an apparatus and method for storing image data comprising a first storage device and a second storage device. The first storage device may be configured to store at least one first pixel from a first field of a frame of the image at a first physical address in the first storage device. The second storage device may be configured to store a second pixel from a second field of the frame of the image at a second physical address in the second storage device. The first and second physical addresses may have the same relative position in an address space of the respective storage devices.

The objects, features and advantages of the present invention include providing a memory video data storage structure that may (i) be optimized for small 2-D data transfers, (ii) store video data in a 2 dimensional structure within tiles, (iii) store video data with field lines interleaved together (e.g., frame store), (iv) separate SDRAM I/O ports into two halves, (v) store odd lines and even lines in different halves, (vi) exchange the role of the two halves at some switching point of a data cluster, (vii) be implemented such that some of the address lines are duplicated and independently controlled so both sides of SDRAM I/Os may be independently controlled, (viii) fetch more than one line of video data every memory burst (e.g., two or four lines per memory burst), (ix) provide that the left half of the SDRAM I/O ports supplies one or two lines of data, and the right half of the SDRAM I/O ports supplies another one or two lines of data (x) be implemented such that a small sized 2 dimensional video data stream could be fetched with most of the bandwidth being utilized, (xi) not need two separate SDRAM controllers to independently control left and right halves of SDRAM I/O ports, (xii) have only one or two SDRAM address pins to the external SDRAMs that are duplicated and independently controlled, (xiii) work for both field and frame video formats, (xiv) provide that only the SDRAM controller needs to change from a conventional approach and shield the rest of the system from the complexity of the 2D data structure, (xv) decode high definition video with low SDRAM bandwidth, (xvi) only touch 4, rather than 8, pages for a frame block transfer for each of the luminance and chrominance signals because data from both fields may be stored in each tile, and/or (xvii) have fewer bursts because lines are stored together.

BRIEF DESCRIPTION OF THE DRAWINGS

These and other objects, features and advantages of the present invention will be apparent from the following detailed description and the appended claims and drawings in which:

FIG. 5A is a more detailed block diagram of the circuit of FIG. 4;

FIGS. 7(A–B) are diagrams illustrating example bank to tile assignments for eight and four memory banks.

DETAILED DESCRIPTION OF THE PREFERRED EMBODIMENTS

Figure 1:
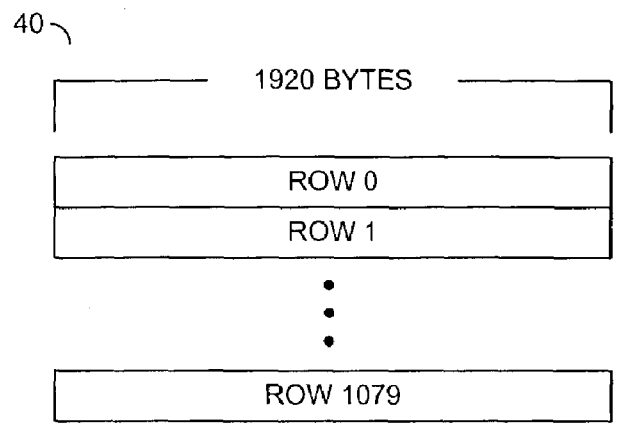
FIG. 1 is a diagram illustrating a conventional raster approach for storing images.
Figure 2:
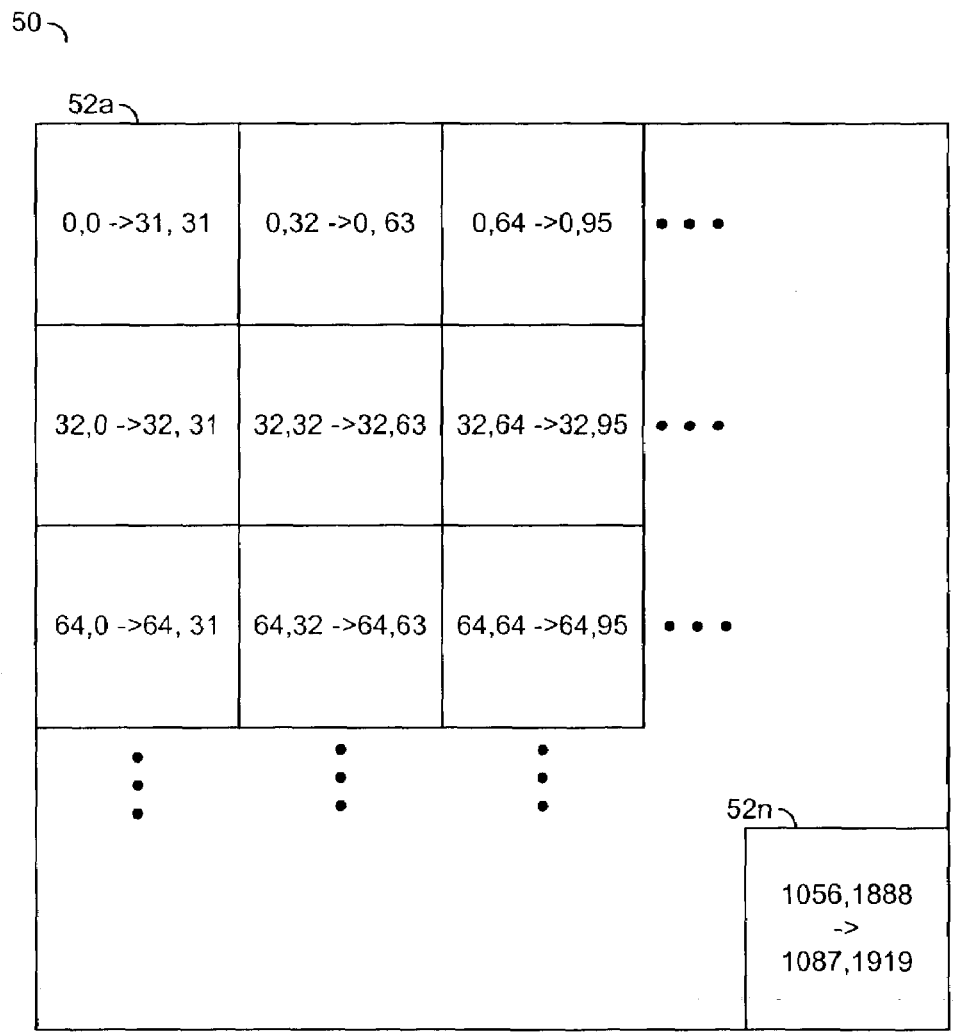
FIG. 2 is a diagram illustrating a conventional tile approach for storing images.
Figure 3:
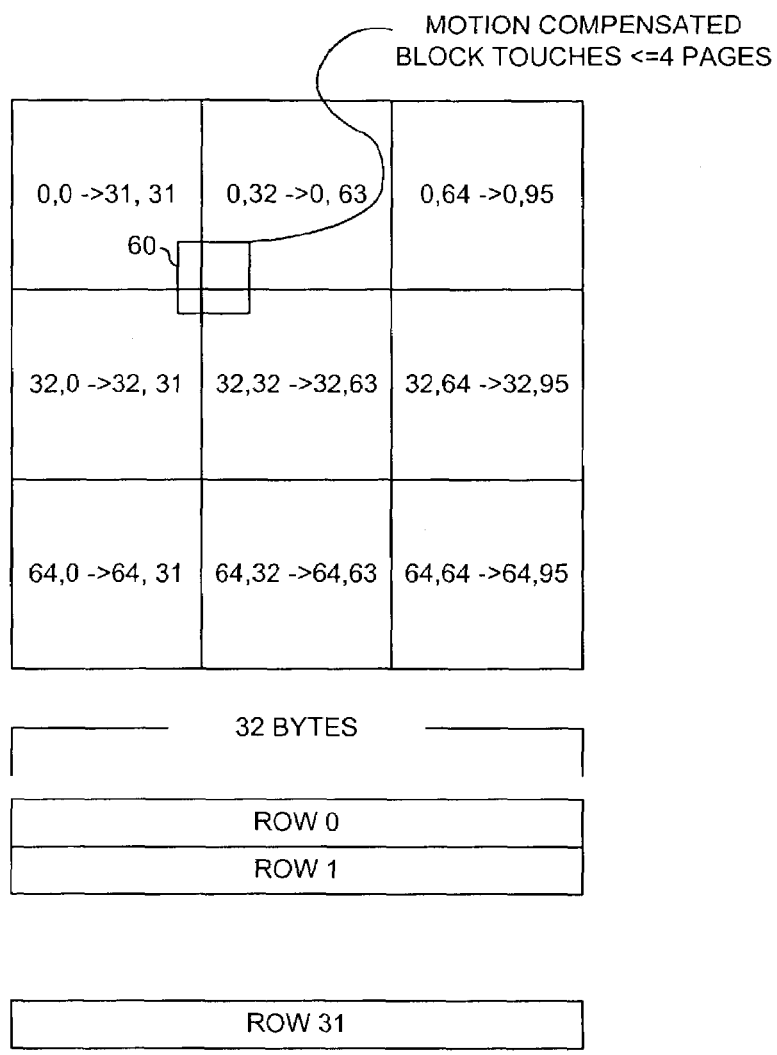
FIG. 3 is a diagram illustrating how raster based data is stored within each tile of FIG. 2.
Figure 4:
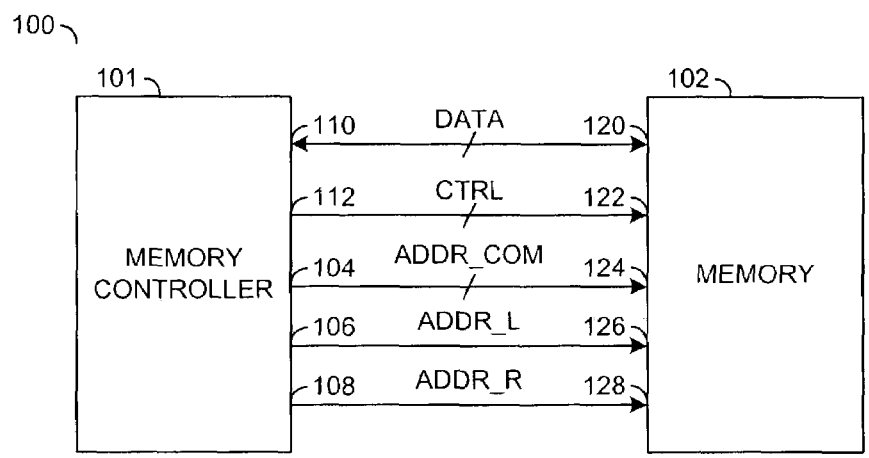
FIG. 4 is a block diagram illustrating a preferred embodiment of the present invention.

Referring to FIG. 4, a system 100 is shown implementing a preferred embodiment of the present invention. The system 100 generally comprises a memory controller 101 and a memory block (or circuit) 102. The memory block 102 generally comprises $2^{N+1}$ memory elements, where N is an integer. The memory block 102 may be implemented, in one example, as a number of memory devices (e.g., 2). The memory controller 101 may have an output 104 that may present a signal (e.g., ADDR_COM), an output 106 that may present a signal (e.g., ADDR_L), an output 108 that may present a signal (e.g., ADDR_R), an input/output 110 that may present/receive a data signal (e.g., DATA), and an output 112 that may present a signal (e.g., CTRL). The signal CTRL may be implemented as one or more control signals. The signal DATA may be implemented as a multi-bit signal. The signal ADDR_COM may comprise one or more common (or shared) address signals. In one example, the signal ADDR_COM may comprise N−1 address signals, where N is an integer. However, other numbers of address signals may be implemented to meet the design criteria of a particular implementation (e.g., N−2). The signal ADDR_L may be implemented as one or more address signals configured to control a portion of the memory 102. The signal ADDR_R may be implemented as one or more address signals configured to control another portion of the memory 102. In general, the signals ADDR_COM, ADDR_L and ADDR_R provide N+1 address signals.

The memory 102 may have an input/output 120 that may receive the signal DATA, an input 122 that may receive the signal CTRL, an input 124 that may receive the signal ADDR_COM, an input 126 that may receive the signal ADDR_L and an input 128 that may receive the signal ADDR_R. The memory 102 may be configured to generate the signal DATA in response to the signals CTRL, ADDR_COM, ADDR_L and ADDR_R.

Referring to FIG. 5A, a more detailed block diagram of the system 100 is shown. The system 100 may further comprise a video encoder, encoder/decoder, compressor, decompressor, decoder or CODEC 140 that may comprise the memory controller 101. The memory 102 may comprise a storage device (or memory) 142 and a storage device (or memory) 144. The storage devices 142 and 144 may be referred to as left memory and right memory, respectively, to aid in the description of the operation of the system 100. The signals CTRL and ADDR_COM may be presented to both the memory 142 and the memory 144. The signal ADDR_L may be presented to the memory 142. The signal ADDR_R may be presented to the memory 144. In a first mode (e.g., a frame mode), the signals ADDR_L and ADDR_R are generally the same. In a second mode (e.g., a field mode), the signal ADDR_R may be a complement of the signal ADDR_L. The signals ADDR_L and ADDR_R may present the most significant bit, the least significant bit or any other bit of an address for accessing the memories 142 and 144. In general, the signals ADDR_L and ADDR_R may be implemented as a middle bit of an address for accessing the memories 142 and 144. While two memories have been described, any number of memories may be implemented accordingly to meet the design criteria of a particular application. For example, each of the memories 142 and 144 may be implemented as two memory chips connected in series (e.g., two slots).

The memory controller circuit 101 may be part of the video decoder (or encoder, or CODEC) chip 140. If each memory (e.g., the memory 142 and the memory 144) has N address pins, there may be N+1 address pins leading out of the memory control unit 101. N−1 address pins are generally shared by both memories 142 and 144. One additional address pin may go to only memory 142, and one additional address pin may go to only memory 144. The value presented on each of the dedicated pins (e.g., either high or low) is generally the same for both chips in the frame mode and is generally inverted (or complemented) in the field mode. A switch (or logic) inside the memory controller 101 generally switches the logic of the dedicated address pins based on the mode selected.

Figure 5B:
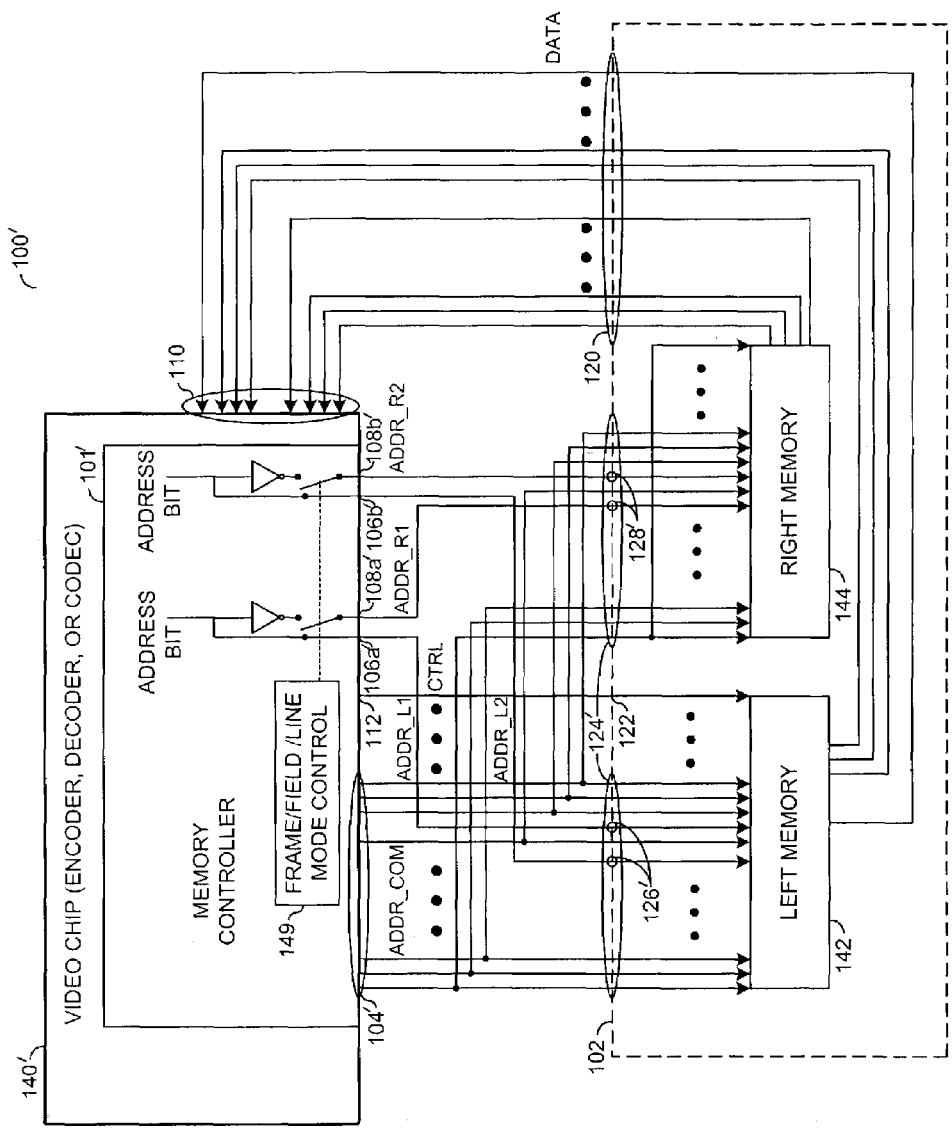
FIG. 5B is a more detailed block diagram of an alternative embodiment of the circuit of FIG. 5A.

Referring to FIG. 5B, a more detailed block diagram of a system 100' is shown illustrating an alternative embodiment of the circuit of FIG. 5A. The system 100' may be implemented similarly to the system 100 except that the signal ADDR_COM may be implemented having N−2 address signals and each of the signals ADDR_L and ADDR_R may be implemented as two address signals (e.g., ADDR_L1, ADDR_L2, ADDR_R1, and ADDR_R2). The system 100' may comprise a memory controller 101' that may be configured to control the relationship between the signals ADDR_L1 and ADDR_R1 and ADDR_L2 and ADDR_R2 in response to one or more control signals from a mode control circuit 149.

The mode control circuit 149 may be configured to select between a number of modes (e.g., a frame read mode, a field read mode, and a line read mode). The modes may also be referred to as frame, field and line modes. For example, in the frame mode the signal ADDR_L1 and a signal ADDR_R1 are generally the same and the signals ADDR_L2 and ADDR_R2 are generally the same. In the field mode, the memory controller 101' may be configured to generate the signals ADDR_R1 as a complement of the signal ADDR_L1 and the signals ADDR_L2 and ADDR_R2 being the same. In the line mode, the controller 101' may be configured to generate the signals ADDR_L1 and ADDR_R1 as being the same and the signal ADDR_R2 as a complement of the signal ADDR_L2. However, other modes may be implemented accordingly to meet the design criteria of a particular implementation.

The circuit 101' may have an output 106a' that may present the signal ADDR_L1, an output 108a' that may present the signal ADDR_R1, an output 106b' that may present the signal ADDR_L2 and an output 108b' that may present the signal ADDR_R2. In one example, the circuit 101', may comprise the mode control circuit 149 that may be configured to control the various relationships between the signals ADDR_L1, ADDR_L2, ADDR_R1, and ADDR_R2. The signals ADDR_L1 and ADDR_R1 are generally generated in response to a predetermined one of the address bits for the memories 142 and 144. The signals ADDR_L2 and ADDR_R2 are generally generated in response to another predetermined one of the address bits of the memories 142 and 144. In one example, the signals ADDR_L1 and ADDR_R1 may be generated in response to address bit 7 while the signals ADDR_L2 and the signal ADDR_R2 may be generated in response to the address bit 5. A more detailed description of frame, field and line modes in accordance with preferred embodiments of the present invention may be found below in connection with TABLES 6A to 6G.

Figure 6:
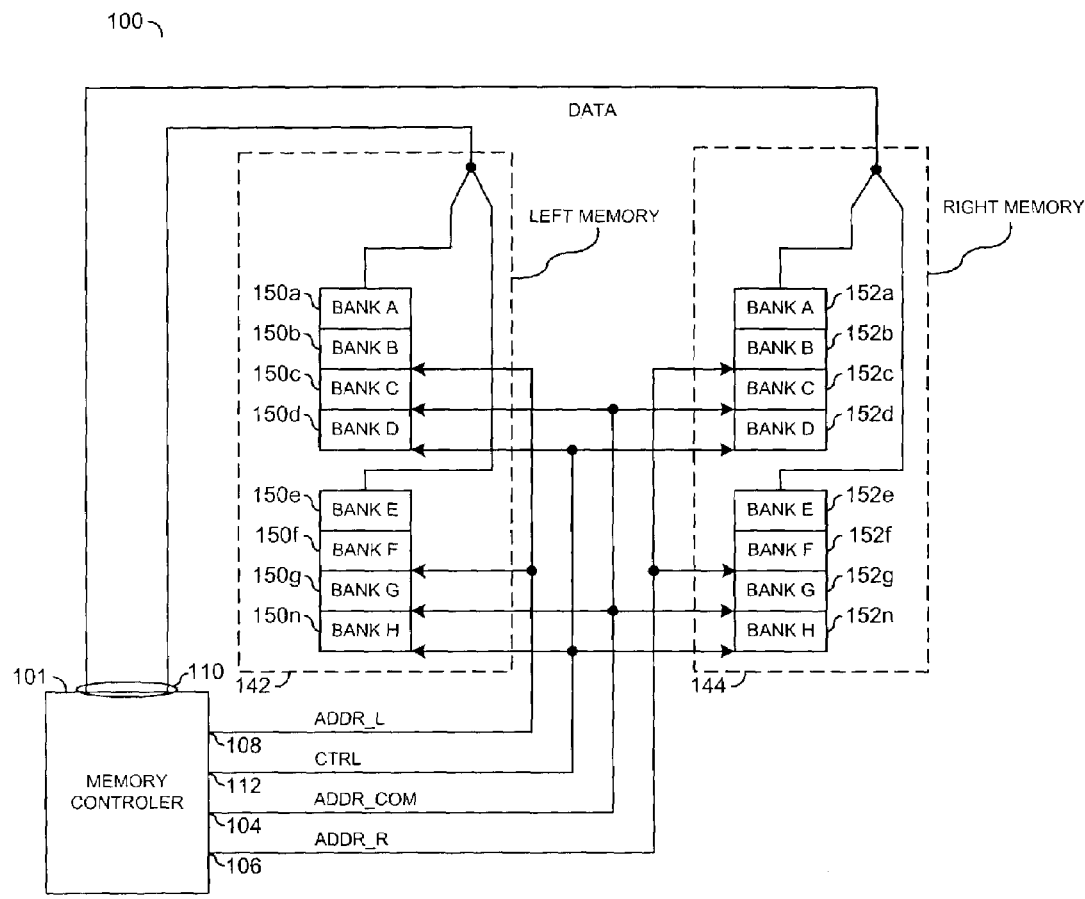
FIG. 6 is a block diagram illustrating a memory bank layout in accordance with a preferred embodiment of the present invention.

Referring to FIG. 6, a more detailed block diagram of the system 100 is shown. The memory 142 and the memory 144 may each comprise a plurality of banks 150a-n and 152a-n, respectively. In one example, the memories 142 and 144 may be implemented with eight banks (e.g., BANK A, BANK B, BANK C, BANK D, BANK E, BANK F, BANK G, and BANK H). In one example, each of the memories 142 and 144 may comprise two memory chips connected in series (e.g., two slots), where each memory chip supplies four of the banks (e.g., BANK A, BANK B, BANK C, and BANK D may be in a first chip and BANK E, BANK F, BANK G, and BANK H in a second chip). However, other memory architectures may be implemented accordingly to meet the design criteria of a particular implementation. For example, the memory 102 may be implemented having four banks (e.g., one 32-bit memory chip or two 16-bit memory chips connected in parallel). The control signals (e.g., R/W/ pre-charge) are generally the same for all of the chips making up the memory 102.

When the system 100 is implemented in accordance with one embodiment of the present invention (e.g., described in more detail in connection with TABLE 1 below), the memory 102 may be implemented as two 32-bit memory chips connected in series. Connecting two chips in series (e.g., two slots) as one memory generally increases the number of banks, as well as the total capacity. However, the number of bytes that are read per clock cycle generally remains the same.

When the system 100 is implemented in accordance with other embodiments of the present invention (e.g., described in more detail in connection with, for example, TABLES 4, 6 and 7 below), the memory 102 may be implemented as a 2×2 array of memory chips (e.g., two 16-bit memory chips connected in series for each of the memories 142 and 144). By connecting the memories 142 and 144 in parallel, the number of banks generally remains the same (e.g., when Bank i is addressed in the memory 142, Bank i in the memory 144 is also addressed). However, the capacity, as well as the number of bytes that may be read per clock cycle, generally doubles.

Referring to FIGS. 7 (A and B), diagrams illustrating example bank to tile assignments for 8 banks and 4 banks are shown. When transferring data to/from one of the banks, the other banks may be pre-charged. When a large number of transfers are performed with the odd transfers using different banks than the even transfers, even pre-charges may be overlapped with odd transfers and odd pre-charges may be overlapped with even transfers. In another example, luminance data for an image may be stored in a different set of banks from chrominance data for the image (e.g., luminance data may be stored in BANKS A–D and chrominance data in BANKS E–H) so that similar overlapping of precharging and transfers may occur. In such a case, the amount of time for a transfer including pre-charge may be the maximum, rather than the sum, of the pre-charge time or the transfer time. When the memory 102 is implemented with only four banks, luminance and chrominance data for the image may each get two banks.

When 8 banks are available, a simple rotating pattern between banks may be used. For example, tiles with luminance (or chrominance) data may be assigned to banks as shown in FIG. 7A, where the numbers 0–3 represent, for example, BANKS A–D for luminance and BANKS E–H for chrominance. Any luminance or chrominance load that is not bigger than a tile generally touches at most one tile from each bank. Because luminance and chrominance generally use different banks, luminance banks may be pre-charged while loading chrominance data and chrominance banks may be pre-charged while loading luminance data. In one example, horizontally and vertically adjacent portions (or tiles) of the image generally use different banks, and diagonally adjacent portions may also use different banks.

When four banks are implemented (e.g., BANKS A–D), luminance and chrominance banks may be associated with tiles in a checkerboard pattern as shown in FIG. 7B, where the numbers 0 and 1 generally represent, for example, BANKS A–B for luminance data and BANKS C–D for chrominance data. When banks are associated with tiles in a checkerboard pattern, vertically adjacent portions (or tiles) of the image generally use different banks, but diagonally adjacent portions (or tiles) of the image generally use the same bank.

An image may be broken into a number of tiles with each tile stored in a page of the memory 102. In each tile, a 32×32 region may be stored from each frame (e.g., 32 wide and 16 tall from each field). There may be various storage formats (e.g., non-raster) within the tile that are considered. The various storage formats may have different tradeoffs between difficulty of implementation, number of memory chips, and performance. When data is stored in a raster format within a tile, at least 9 bursts may be transferred to retrieve a 9×9 region. A non-raster storage format may use fewer bursts to retrieve a 9×9 region.

A given tile dimension and storage format generally determines which one of the address bits of the memories 142 and 144 is controlled by the signals ADDR_L and ADDR_R (or which two address bits when the signals ADDR_L1, ADDR_L2, ADDR_R1 and ADDR_R2 are implemented). For example, a 32×32 byte tile may be implemented. Either 2 fields or 2 frame lines of an image may be stored together depending on the bit that is toggled. The type of lines to be stored generally determines which bit to toggle. In one example, the memory controller 101 may be configured to support one format. However, a memory controller configured to support multiple formats may be implemented to meet design criteria of a particular application. If each memory chip has N address pins, the memory controller 101 generally has N+1 address pins.

The memory 102 may be implemented, in one example, as synchronous dynamic random access memory (SDRAM). It may typically take twelve clock cycles to open a page when an SDRAM page is not open. A current page may be pre-charged during a transfer of a previous page if the transfers use different banks. One approach to ensure that transfers use different banks during a motion compensation process is to alternate luminance and chrominance data loads. Once a page is open, data in 2-cycle (e.g., 4-edge) bursts may be used (e.g., when using DDR_II type SDRAM). When the memory 102 is implemented as one 32-bit wide chip, a burst may comprise 16 bytes aligned to a 16 byte boundary. When the memory 102 is implemented with two 16-bit wide chips (e.g., the memories 142 and 144 may be implemented with 16-bit wide memory chips), a burst may comprise 8 bytes aligned to an 8 byte boundary from each of the memory chips. In general, the addressing for both of the memories 142 and 144 is generally the same so that in two cycles a total of 16 bytes, 16 byte aligned may be obtained. In one example, a cycle rate of 200 Mhz may provide approximately 800 clocks per macroblock when decoding an HDTV sequence. The video compression scheme may be configured to accommodate concurrent memory reads and precharges.

In a motion compensation stage of video compression, a broadcast profile may, for example, only allow vectors smaller than 8×8 if bi-directional motion compensation is not used. In that case, 4×4 uni-directional motion may be the worst-case (e.g., the most difficult to retrieve). Hence, the following example focuses on 4×4 uni-directional motion.

When a storage method that overlaps pre-charge time and transfer time is implemented, motion compensation may take more than 100% of available DMA cycles in the worst case. The present invention generally provides for reasonable utilization. In one example, the memory 102 may be implemented as a single memory chip with a 32-bit wide bus. Alternatively, two memory chips may be implemented as the memories 142 and 144. The memory chips 142 and 144 may be controlled separately with only one address pin that differs. By controlling the chips separately, the data may be stored as though groups of K lines within a tile were transposed. The lines may be K frame lines or K field lines based on whether the chips are controlled together or separately.

In one embodiment of the present invention, pixels may be stored as alternating pairs of top (even) and bottom (odd) field lines. An example pixel layout having alternating pairs of top/bottom fields is generally illustrated in the following TABLE 1.

TABLE 1

| 0,0 | 2,0 | 0,1 | 2,1 | 0,2 | 2,2 | 0,3 | 2,3 | 0,4 | 2,4 | 0,5 | 2,5 | 0,6 | 2,6 | 0,7 | 2,7 |
|---|---|---|---|---|---|---|---|---|---|---|---|---|---|---|---|
| 1,0 | 3,0 | 1,1 | 3,1 | 1,2 | 3,2 | 1,3 | 3,3 | 1,4 | 3,4 | 1,5 | 3,5 | 1,6 | 3,6 | 1,7 | 3,7 |
| 4,0 | 6,0 | 4,1 | 6,1 | 4,2 | 6,2 | 4,3 | 6,3 | 4,4 | 6,4 | 4,5 | 6,5 | 4,6 | 6,6 | 4,7 | 6,7 |
| 5,0 | 7,0 | 5,1 | 7,1 | 5,2 | 7,2 | 5,3 | 7,3 | 5,4 | 7,4 | 5,5 | 7,5 | 5,6 | 7,6 | 5,7 | 7,7 |
| 8,0 | A,0 | 8,1 | A,1 | 8,2 | A,2 | 8,3 | A,3 | 8,4 | A,4 | 8,5 | A,5 | 8,6 | A,6 | 8,7 | A,7 |
| 9,0 | B,0 | 9,1 | B,1 | 9,2 | B,2 | 9,3 | B,3 | 9,4 | B,4 | 9,5 | B,5 | 9,6 | B,6 | 9,7 | B,7 |

In TABLE 1, each square contains a pair of numbers (Y,X) representing a position of the pixel in an image (e.g., at frame line Y and column X). In one example, an even Y value may indicate the pixel is from the top field and an odd Y value may indicate the pixel is from the bottom field. Each row may comprise pixels from two adjacent lines of the same field. For example, the first two lines of the top field (e.g., lines 0 and 2 of the frame) may be stored in the first row (e.g., ROW 0), followed by the first two lines from the bottom field (e.g., lines 1 and 3 of the frame). Subsequent pairs of lines from the top and bottom fields are generally stored similarly. The two lines stored in a row, may be arranged by alternately taking a pixel from the first line and then the second line. In general, one burst may transfer a 2V×4H region from one field and two bursts (e.g., ROW0 and ROW1) may transfer a 4V×8H region from the frame.

In one example, line-pairs from opposite fields may be alternated to reduce the number of pages accessed for frame motion compensation. However, other organizations of lines may be implemented to meet the design criteria of a particular implementation. For example, when each tile holds a total of K lines, K/2 lines from the top field may be stored followed by K/2 lines from the bottom field. However, interleaving lines from both fields, as shown in TABLE 1, generally provides support for multiple formats based on the memory configuration used.

When image data is arranged as illustrated in TABLE 1, field motion compensation may be more efficient than frame motion compensation. The following discussion uses frame motion compensation as a worst case. In general, when 6-tap sub-pixel interpolation filters are used, 4×4 frame motion compensation uses a 9×9 region from the frame.

A 2-cycle burst generally provides a 2×8 region from one field (e.g., 2-byte aligned vertically, 8-byte aligned horizontally). In two such bursts, a 2×16 region from one field (e.g., 2-byte aligned vertically, 8-byte aligned horizontally) may be obtained that may cover any 9 pixels horizontally. At most 6, but on average 5.5, 2×16 field regions may cover a 9×9 pixel region in the frame, as may be summarized in the following TABLE 2. The total number of cycles taken to retrieve the 9×9 region may be expressed by 2*2*6=24 cycles in a worst case scenario and 22 for an average case scenario.

TABLE 2

| Frame lines | Field pairs | #field pairs |
|---|---|---|
| 0–8 | 0–2, 1–3, 4–6, 5–7, 8–10 | 5 |
| 1–9 | 0–2, 1–3, 4–6, 5–7, 8–10, 9–11 | 6 |
| 2–10 | 0–2, 1–3, 4–6, 5–7, 8–10, 9–11 | 6 |
| 3–11 | 1–3, 4–6, 5–7, 8–10, 9–11 | 5 |

In one example, a line buffer may be provided at capture to store two lines together. A line buffer is generally provided at display to efficiently read two lines together and display each line individually.

Image data is generally represented by three rectangular matrices of pixel data, luminance (e.g., luma or Y) and two chrominance values (e.g., chroma Cb and Cr). The luminance and chrominance values correspond to a decomposed representation of the three primary colors associated with each picture element (or pixel). The two chroma components are generally reduced to one-half the vertical and horizontal resolution of the luma component (e.g., 4:2:0 sub-sampling). The chrominance generally comprises two components; red chrominance (e.g., Cr) and blue chrominance (e.g., Cb). When 2-tap sub-pixel interpolation pixels are used for chrominance, 4×4 vectors (e.g., 2×2 from each chrominance component) generally use a 3×3 co-located region from each of the Cb field and the Cr field. Cb and co-located Cr pixels may be stored adjacent to each other. In two cycles, a 2×4 region from one field may be obtained. In one example, any 3 lines and 4-pixel wide, 4 pixel aligned region may be stored/retrieved in three two-cycle bursts in the worst case, and 2.5 burst on average. Examples of the number of two-cycle bursts per 3 line transfer may be summarized as in the following TABLE 3.

TABLE 3

| Frame lines | Field pairs |
|---|---|
| 0–2 | 0–2, 1–3 |
| 1–3 | 0–2, 1–3 |
| 2–4 | 0–2, 1–3, 4–6 |
| 3–5 | 1–3, 4–6, 5–7 |
| 4–6 | 4–6, 5–7 |
| 5–7 | 4, 6, 5–7 |
| 6–8 | 4–6, 5–7, 8–10 |
| 7–9 | 5–7, 8–10, 9–11 |

In general, no more than 2*2*3=12 cycles are used to load the chroma values Cr and Cb. On average, 2*2*2.5=10 cycles may be sufficient. However, up to 12 cycles may be used because of page faults.

In one example, pre-charging of the next luminance page may be started during the chrominance data transfer and the chrominance transfer may take at least 12 cycles. In another example, the luminance values may be stored in banks A, B, C, and D and the chrominance values Cr and Cb may be stored in banks E, F, G, and H. Each of the luminance value and chrominance value transfers may use up to 4 banks. However, fewer banks may be used, especially for small blocks. For example, when two blocks of luminance data and two blocks of chrominance data are to be transferred and the two luminance blocks use different banks (e.g., luminance transfer 1 uses banks A–B and luminance transfer 2 uses bank C), during the first luminance transfer, both the chrominance banks and bank C may be pre-charged. If the chrominance transfer takes 8 cycles, the second luminance transfer may start 8 cycles after the chrominance transfer starts because the bank C is already pre-charged. By making the pre-charging design more efficient, the average chrominance transfer time may be approximately 10.5 cycles per 4×4 block.

Overall, transfer of a 4×4 block may take no more than 24+12=36 cycles as a worst case and 22+10.5=32.5 cycles on average. With such performance, transfer of a complete macroblock may take a maximum of 576 cycles and an average time of 520 cycles.

In a conventional approach, pixels within a tile are stored in raster format. In a storage format in accordance with a preferred embodiment of the present invention (described in more detail above in connection with TABLE 1), the raster format is generally not used within a tile. Instead, each tile is generally broken up into sub-tiles. For example, with reference to TABLE 1, the order for storing pixels may be (0,0), (2,0), (0,1), etc. That is, a first sub-tile may comprise rows 0 and 2, then a second sub-tile may comprise rows 1 and 3, etc. In contrast, the conventional approach uses raster storage: (0,0), (0,1) . . . (0,31), (1,0), (1,1), etc.

In an alternative embodiment of the present invention, two frame/field lines may be stored together. For example, pixel 0,0 from the frame (e.g., pixel 0,0 of the top field) may be stored at address 0 in the left memory 142 and co-located pixel 1,0 (e.g., pixel 0,0 of the bottom field) may be stored at address 0 in the right memory 144. As used herein, the term co-located generally refers to pixels having similar spatial positions relative to the start of a respective field. For example, the pixel 0,0 from the top field and the pixel 0,0 from the bottom field may be stored at a physical address having the same relative position in an address space of a respective storage device. An example of such a storage scheme is generally illustrated in the following TABLE 4:

TABLE 4

| L | R | L | R | L | R | L | R | L | R | L | R | L | R | L | R | L | R | L | R | L | R | L | R |
|---|---|---|---|---|---|---|---|---|---|---|---|---|---|---|---|---|---|---|---|---|---|---|---|
| 0,0 | 0,1 | 1,0 | 1,1 | 0,2 | 0,3 | 1,3 | 1,3 | 0,4 | 0,5 | 1,4 | 1,5 | 0,6 | 0,7 | 1,6 | 1,7 |  |  | 1,8 | 1,9 |  |  | 1,A | 1,B |
| 3,0 | 3,1 | 2,0 | 2,1 | 3,2 | 3,3 | 2,2 | 2,3 | 3,4 | 3,5 | 2,4 | 2,5 | 3,6 | 3,7 | 2,6 | 2,7 | 3,8 | 3,9 |  |  | 3,A | 3,B |  |  |
| 4,0 | 4,1 | 5,0 | 5,1 | 4,2 | 4,3 | 5,2 | 5,3 | 4,4 | 4,5 | 5,4 | 5,5 | 4,6 | 4,7 | 5,6 | 5,7 | 4,8 | 4,9 | 5,8 | 5,9 | 4,A | 4,B | 5,A | 5,B |
| 7,0 | 7,1 | 6,0 | 6,1 | 7,2 | 7,3 | 6,2 | 6,3 | 7,4 | 7,5 | 6,4 | 6,5 | 7,6 | 7,7 | 6,6 | 6,7 | 7,8 | 7,9 | 6,8 | 6,9 | 7,A | 7,B | 6,A | 6,B |

In general, any tile size may be selected to meet the design criteria of a particular implementation. In order to simplify the discussion, a tile size of 32×32 will be used for illustration purposes. However, the description may be applied to other tile sizes. The pixels of the 32×32 tile may be stored as illustrated in TABLE 4, where L generally represents the left memory 142 and R generally represents the right memory 144. The two sets of shaded entries (e.g., the light gray shaded entries 0,0–0,7 and 2,0–2,7 and the dark gray shaded entries 0,8–0,B and 2,8–2,B) generally represent bytes transferred in each of two bursts. An example of physical addresses of the individual pixels in the respective memories 142 and 144 may be summarized in the TABLE 5:

TABLE 5

| | Left Memory Chip | | Right Memory Chip | |
|---|---|---|---|---|
| Address | Row | Col | Row | Col |
| 0 | 0 | 0 | 1 | 0 |
| 1 | 0 | 1 | 1 | 1 |
| 2 | 0 | 2 | 1 | 2 |
| 3 | 0 | 3 | 1 | 3 |
| ... | ... | ... | ... | ... |
| 31 | 0 | 31 | 1 | 31 |
| 32 | 3 | 0 | 2 | 0 |
| 33 | 3 | 1 | 2 | 1 |
| 34 | 3 | 2 | 2 | 2 |
| 35 | 3 | 3 | 2 | 3 |

TABLE 5-continued

| | Left Memory Chip | | Right Memory Chip | |
|---|---|---|---|---|
| Address | Row | Col | Row | Col |
| ... | ... | ... | ... | ... |
| 63 | 3 | 31 | 2 | 31 |
| 64 | 4 | 0 | 5 | 0 |
| 65 | 4 | 1 | 5 | 1 |
| 66 | 4 | 2 | 5 | 2 |
| 67 | 4 | 3 | 5 | 3 |

During a frame reading mode, in each cycle, data may be read by addressing the same bytes from each of the memories 142 and 144. In each half-cycle, a 2×2 block of the frame may be read. In a 2-cycle burst, a 2×8 block of the frame is generally read. Transfer of a 9×9 block generally takes 20 cycles.

In a field reading mode, the location addressed in the memory 144 and the location addressed in the memory 142 may differ by one row in each burst. Because the tile width may be a power of two, the value of only one address pin may be changed to select a different row (e.g., inverted for the right memory 144 as compared to the left memory 142). In general, for a tile of width W, the addresses presented to the memories 142 and 144 generally differ by the value W. In one example, the address bit $\log_2(W)$ may be high for the left memory 142 and low for the right memory 144 when reading an even (e.g., top) field. The reverse may be true when reading an odd (e.g., bottom) field.

In a single 2-cycle burst, 8 bytes (e.g., 8 byte aligned) may be obtained from each of the memories 142 and 144. As shown in TABLE 4, the light gray shaded bytes (pixels) may be transferred in a first burst and the dark gray shaded pixels may be transferred in a second burst. Fetching 9 pixels at any alignment generally takes two 8-byte bursts (e.g., 4 cycles). At 4 cycles per 2 rows (e.g., one row from each memory), a fetch of 9 rows generally takes 20 cycles. The just described storage format generally divides each tile into sub-tiles, in a way similar to the storage format illustrated in TABLE 1. When both memory 142 and 144 are viewed as a single unified memory (e.g., the addresses used for both memories are identical), the just-described storage format generally breaks each tile into sub-tiles comprising two consecutive frame lines. For example, referring to TABLE 4, a first sub-tile (or row) generally comprises lines 0 and 1 of the frame, a next sub-tile generally comprises lines 2 and 3 of the frame, etc. TABLE 4 may be contrasted to TABLE 1 where the sub-tiles comprise field-line pairs.

Additionally, when using the conventional approach with two memories, if a given address on the left memory is used for a pixel from field F, row Y and column X, the same address on the right memory will hold another pixel from the same line (i.e., field F, row Y, column X'). In contrast, the present invention uses the address on the right memory for a pixel located in the same position but in the other field (e.g., field F', row Y, column X, where F'=top if F=bottom and F'=bottom if F=top). For example, as may be summarized in TABLE 5, address 0 on the left memory generally holds the pixel in frame row 0 (top field, field row 0) column 0, whereas address 0 on the right memory generally holds the pixel from frame row 1 (bottom field, field row 0) column 0.

In general, the storage order of the current example allows a store or a load of a single line to use only one memory (e.g., either the memory 142 or the memory 144). The number of memory cycles used for capture or display is generally doubled when each line uses only one chip. A capture or display penalty may be avoided by either adding a one line buffer in the display and capture units or by switching the role of the left memory 142 and right memory 144, for example, after a predetermined number of columns. The number of columns may be determined by the burst length (e.g., every 8 columns). Switching the role of the memories 142 and 144 may result in a more complex addressing scheme. However, both memories 142 and 144 may be used to provide each line. An example of such an addressing scheme is generally illustrated in the following TABLE 6:

memories (e.g., for display or capture), the addresses for the left and right memories generally differ by the burst length. Since the burst length is generally a power of two, an additional address pin may be complemented (or inverted) for the left and right memories (described in more detail in connection with FIG. 5B). In this embodiment, two address pins may differ between the left and right memories. In the frame mode (e.g., when addressing a block within a frame), the addresses presented to both of the memories 142 and 144 are generally the same. In the field mode (e.g., when addressing a block within a field), a first one of the address bits generally differs between the memories 142 and 144. In the line mode (e.g., when addressing a line), a second one of the address bits generally differs between the memories 142 and 144.

The following examples generally illustrate the three addressing modes. For the frame mode, in a single burst a 2×8 region from the frame may be loaded. An example of the data from each of the memories 142 and 144 is generally illustrated in the following TABLE 6A. The data is generally shown separately (top) and together (bottom).

TABLE 6

| L | R | L | R | L | R | L | R | L | R | L | R | L | R | L | R | L | R | L | R | L | R |
|---|---|---|---|---|---|---|---|---|---|---|---|---|---|---|---|---|---|---|---|---|---|
| 0,0 | 0,1 | 1,0 | 1,1 | 0,2 | 0,3 | 1,2 | 1,3 | 0,4 | 0,5 | 1,4 | 1,5 | 0,6 | 0,7 | 1,6 | 1,7 | ▓ | ▓ | 0,8 | 0,9 | ▓ | ▓ | 0,A | 0,B |
| 3,0 | 3,1 | 2,0 | 2,1 | 3,2 | 3,3 | 2,2 | 2,3 | 3,4 | 3,5 | 2,4 | 2,5 | 3,6 | 3,7 | 2,6 | 2,7 | 2,8 | 2,9 | ▓ | ▓ | 2,A | 2,B | ▓ | ▓ |
| 4,0 | 4,1 | 5,0 | 5,1 | 4,2 | 4,3 | 5,2 | 5,3 | 4,4 | 4,5 | 5,4 | 5,5 | 4,6 | 4,7 | 5,6 | 5,7 | 5,8 | 5,9 | 4,8 | 4,9 | 5,A | 5,B | 4,A | 4,B |
| 7,0 | 7,1 | 6,0 | 6,1 | 7,2 | 7,3 | 6,2 | 6,3 | 7,4 | 7,5 | 6,4 | 6,5 | 7,6 | 7,7 | 6,6 | 6,7 | 6,8 | 6,9 | 7,8 | 7,9 | 6,A | 6,B | 7,A | 7,B |

Because each memory switches between rows every burst length, when accessing the same row on the left and right

TABLE 6A

| | H | | | | | | | | | | | | | | | | | | | | | | |
|---|---|---|---|---|---|---|---|---|---|---|---|---|---|---|---|---|---|---|---|---|---|---|---|
| | Left | | | | | | | | | | | | Right | | | | | | | | | | | |
| V | 0 | 1 | 2 | 3 | 4 | 5 | 6 | 7 | 8 | 9 | 10 | 11 | 0 | 1 | 2 | 3 | 4 | 5 | 6 | 7 | 8 | 9 | 10 | 11 |
| 0 | 0,0 | 0,1 | 0,2 | 0,3 | 0,4 | 0,5 | 0,6 | 0,7 | ▓ | ▓ | ▓ | ▓ | ▓ | ▓ | ▓ | ▓ | ▓ | ▓ | ▓ | ▓ | ▓ | ▓ | ▓ | ▓ |
| 64 | 3,0 | 3,1 | 3,2 | 3,3 | 3,4 | 3,5 | 3,6 | 3,7 | 2,8 | 2,9 | 2,A | 2,B | 2,0 | 2,1 | 2,2 | 2,3 | 2,4 | 2,5 | 2,6 | 2,7 | 3,8 | 3,9 | 3,A | 3,B |
| 128 | 4,0 | 4,1 | 4,2 | 4,3 | 4,4 | 4,5 | 4,6 | 4,7 | 5,8 | 5,9 | 5,A | 5,B | 5,0 | 5,1 | 5,2 | 5,3 | 5,4 | 5,5 | 5,6 | 5,7 | 4,8 | 4,9 | 4,A | 4,B |
| 192 | 7,0 | 7,1 | 7,2 | 7,3 | 7,4 | 7,5 | 7,6 | 7,7 | 6,8 | 6,9 | 6,A | 6,B | 6,0 | 6,1 | 6,2 | 6,3 | 6,4 | 6,5 | 6,6 | 6,7 | 7,8 | 7,9 | 7,A | 7,B |

| | H | | | | | | | | | | | | | | | | | | | | | | |
|---|---|---|---|---|---|---|---|---|---|---|---|---|---|---|---|---|---|---|---|---|---|---|---|
| | 0 | 1 | 0 | 1 | 2 | 3 | 2 | 3 | 4 | 5 | 4 | 5 | 6 | 7 | 6 | 7 | 8 | 9 | 8 | 9 | 10 | 11 | 10 | 11 |
| V | L | R | L | R | L | R | L | R | L | R | L | R | L | R | L | R | L | R | L | R | L | R | L | R |
| 0 | 0,0 | 0,1 | ▓ | ▓ | 0,2 | 0,3 | ▓ | ▓ | 0,4 | 0,5 | ▓ | ▓ | 0,6 | 0,7 | ▓ | ▓ | ▓ | ▓ | ▓ | ▓ | ▓ | ▓ | ▓ | ▓ |
| 64 | 3,0 | 3,1 | 2,0 | 2,1 | 3,2 | 3,3 | 2,2 | 2,3 | 3,4 | 3,5 | 2,4 | 2,5 | 3,6 | 3,7 | 2,6 | 2,7 | 2,8 | 2,9 | 3,8 | 3,9 | 2,A | 2,B | 3,A | 3,B |
| 128 | 4,0 | 4,1 | 5,0 | 5,1 | 4,2 | 4,3 | 5,2 | 5,3 | 4,4 | 4,5 | 5,4 | 5,5 | 4,6 | 4,7 | 5,6 | 5,7 | 5,8 | 5,9 | 4,8 | 4,9 | 5,A | 5,B | 4,A | 4,B |
| 192 | 7,0 | 7,1 | 6,0 | 6,1 | 7,2 | 7,3 | 6,2 | 6,3 | 7,4 | 7,5 | 6,4 | 6,5 | 7,6 | 7,7 | 6,6 | 6,7 | 6,8 | 6,9 | 7,8 | 7,9 | 6,A | 6,B | 7,A | 7,B |

The address of each pixel is generally the sum of the number V (shown on the left) and H (shown on top). The example is for a tile width of 32, and sub-tiles that are two rows high (e.g., V increases by 2*32=64 every line). In TABLE 6A, the light shaded squares (e.g., H=0–7) generally show the pixels accessed in a first burst (e.g., to get the region 0,0–>1,7 from the frame). The dark squares (e.g., H=8–11) generally show the pixels accessed in a second burst (e.g., to get the region 0,8–>1,15 from the frame). The thick vertical lines generally represent half-cycle periods.

In the following TABLE 6B, example start and end addresses of several "frame mode" bursts are generally illustrated. The gray columns generally indicate the starting binary addresses. In general, starting and ending addresses are generally the same for the left and right memories.

TABLE 6B

Frame MC examples. Left and right chips get the same addresses

| | Left chip | | | | Right chip | | | |
|---|---|---|---|---|---|---|---|---|
| Coordinates | Start | Binary | End | Binary | Start | Binary | End | Binary |
| 0,0–1,7 | 0 + 0 = 0 | | 0 + 7 = 7 | 111 | 0 + 0 = 0 | | 0 + 7 = 7 | 111 |
| 0,8–1,15 | 0 + 8 = 8 | | 0 + 15 = 15 | 1111 | 0 + 8 = 8 | | 0 + 15 = 15 | 1111 |
| 2,0–3,7 | 64 + 0 = 64 | | 64 + 7 = 71 | 1000111 | 64 + 0 = 64 | | 64 + 7 = 71 | 1000111 |
| 2,8–3,15 | 64 + 8 = 72 | | 64 + 15 = 79 | 1001111 | 64 + 8 = 72 | | 64 + 15 = 79 | 1001111 |

In the following TABLE 6C, an example of two bursts for accessing a 2×8 region in the top field is shown. The light shaded squares (e.g., H=0–7) generally correspond to the top-field pixels 0,0–>2,7, and the dark shaded squares (e.g., H=8–11) generally correspond to the top-field pixels 0,8–>2,15. The thicker vertical lines in the bottom portion of TABLE 6C generally represent half-cycle periods.

TABLE 6C

| | H | | | | | | | | | | | | | | | | | | | | | | | |
|---|---|---|---|---|---|---|---|---|---|---|---|---|---|---|---|---|---|---|---|---|---|---|---|---|
| | Left | | | | | | | | | | | | Right | | | | | | | | | | | |
| V | 0 | 1 | 2 | 3 | 4 | 5 | 6 | 7 | 8 | 9 | 10 | 11 | 0 | 1 | 2 | 3 | 4 | 5 | 6 | 7 | 8 | 9 | 10 | 11 |
| 0 | 0,0 | 0,1 | 0,2 | 0,3 | 0,4 | 0,5 | 0,6 | 0,7 | 1,8 | 1,9 | 1,A | 1,B | 1,0 | 1,1 | 1,2 | 1,3 | 1,4 | 1,5 | 1,6 | 1,7 | 0,8 | 0,9 | 0,A | 0,B |
| 64 | 3,0 | 3,1 | 3,2 | 3,3 | 3,4 | 3,5 | 3,6 | 3,7 | 2,8 | 2,9 | 2,A | 2,B | 2,0 | 2,1 | 2,2 | 2,3 | 2,4 | 2,5 | 2,6 | 2,7 | 3,8 | 3,9 | 3,A | 3,B |
| 128 | 4,0 | 4,1 | 4,2 | 4,3 | 4,4 | 4,5 | 4,6 | 4,7 | 5,8 | 5,9 | 5,A | 5,B | 5,0 | 5,1 | 5,2 | 5,3 | 5,4 | 5,5 | 5,6 | 5,7 | 4,8 | 4,9 | 4,A | 4,B |
| 192 | 7,0 | 7,1 | 7,2 | 7,3 | 7,4 | 7,5 | 7,6 | 7,7 | 6,8 | 6,9 | 6,A | 6,B | 6,0 | 6,1 | 6,2 | 6,3 | 6,4 | 6,5 | 6,6 | 6,7 | 7,8 | 7,9 | 7,A | 7,B |

| | H | | | | | | | | | | | | | | | | | | | | | | | |
|---|---|---|---|---|---|---|---|---|---|---|---|---|---|---|---|---|---|---|---|---|---|---|---|---|
| | 0 | 1 | 0 | 1 | 2 | 3 | 2 | 3 | 4 | 5 | 4 | 5 | 6 | 7 | 6 | 7 | 8 | 9 | 8 | 9 | 10 | 11 | 10 | 11 |
| V | L | | R | | L | | R | | L | | R | | L | | R | | L | | R | | L | | R | |
| 0 | 0,0 | 0,1 | 1,0 | 1,1 | 0,2 | 0,3 | 1,2 | 1,3 | 0,4 | 0,5 | 1,4 | 1,5 | 0,6 | 0,7 | 1,6 | 1,7 | 1,8 | 1,9 | 0,8 | 0,9 | 1,A | 1,B | 0,A | 0,B |
| 64 | 3,0 | 3,1 | 2,0 | 2,1 | 3,2 | 3,3 | 2,2 | 2,3 | 3,4 | 3,5 | 2,4 | 2,5 | 3,6 | 3,7 | 2,6 | 2,7 | 2,8 | 2,9 | 3,8 | 3,9 | 2,A | 2,B | 3,A | 3,B |
| 128 | 4,0 | 4,1 | 5,0 | 5,1 | 4,2 | 4,3 | 5,2 | 5,3 | 4,4 | 4,5 | 5,4 | 5,5 | 4,6 | 4,7 | 5,6 | 5,7 | 5,8 | 5,9 | 4,8 | 4,9 | 5,A | 5,B | 4,A | 4,B |
| 192 | 7,0 | 7,1 | 6,0 | 6,1 | 7,2 | 7,3 | 6,2 | 6,3 | 7,4 | 7,5 | 6,4 | 6,5 | 7,6 | 7,7 | 6,6 | 6,7 | 6,8 | 6,9 | 7,8 | 7,9 | 6,A | 6,B | 7,A | 7,B |

In the following TABLE 6D, example addresses for several top-field accesses are generally illustrated. In general, the left and right start addresses (e.g., the gray shaded entries) generally differ by one bit (e.g., binary 1000000). The same is generally true for the end addresses.

TABLE 6D

Top field MC examples. Left and right chips differ addresses differ by 64

| | Left chip | | | | Right chip | | | |
|---|---|---|---|---|---|---|---|---|
| Coordinates | Start | Binary | End | Binary | Start | Binary | End | Binary |
| 0,0–2,7 | 0 + 0 = 0 | | 0 + 7 = 7 | 111 | 64 + 0 = 64 | | 64 + 7 = 71 | 1000111 |
| 0,8–2,15 | 64 + 8 = 72 | | 64 + 15 = 79 | 1001111 | 0 + 8 = 8 | | 0 + 15 = 15 | 1111 |
| 4,0–6,7 | 128 + 0 = 128 | | 128 + 7 = 135 | 10000111 | 192 + 0 = 192 | | 192 + 7 = 199 | 11000111 |
| 4,8–6,15 | 192 + 8 = 200 | | 192 + 15 = 207 | 11001111 | 128 + 8 = 136 | | 128 + 15 = 143 | 10001111 |

In the following TABLE 6E, example addresses for several bottom-field accesses are generally illustrated. In general, the left and right start addresses (e.g., indicated by the gray shading) generally differ by one bit (e.g., binary 1000000). The same is generally true for the end addresses.

TABLE 6E

Bottom field MC examples. Left and right chips differ addresses differ by 64

| | Left chip | | | | Right chip | | | |
|---|---|---|---|---|---|---|---|---|
| Coordinates | Start | Binary | End | Binary | Start | Binary | End | Binary |
| 1,0–3,7 | 64 + 0 = 32 | | 64 + 7 = 71 | 1000111 | 0 + 0 = 0 | | 0 + 7 = 7 | 111 |
| 1,8–3,15 | 0 + 8 = 8 | | 0 + 15 = 15 | 1111 | 64 + 8 = 72 | | 64 + 15 = 79 | 1001111 |
| 5,0–7,7 | 192 + 0 = 192 | | 192 + 7 = 199 | 11000111 | 128 + 0 = 128 | | 128 + 7 = 135 | 10000111 |
| 5,8–7,15 | 128 + 8 = 136 | | 128 + 15 = 143 | 10001111 | 192 + 8 = 200 | | 192 + 15 = 207 | 11001111 |

In the following TABLE 6F, generally illustrates an example access pattern for a line mode in accordance with the present invention. The light gray squares (e.g., H=0–7 for the left memory and H=8–11 for the right memory) generally show the pixels accessed for the block 0,0–0,15 from frame line 0. The dark gray squares (e.g., H=8–11 for the left memory and H=0–7 for the right memory) generally show the pixels accessed for the block 1,0–1,15 from frame line 1. The thicker vertical lines in the bottom portion of TABLE 6F generally represent half-cycle periods.

TABLE 6F

| | H | | | | | | | | | | | | | | | | | | | | | | |
|---|---|---|---|---|---|---|---|---|---|---|---|---|---|---|---|---|---|---|---|---|---|---|---|
| | Left | | | | | | | | | | | | Right | | | | | | | | | | |
| V | 0 | 1 | 2 | 3 | 4 | 5 | 6 | 7 | 8 | 9 | 10 | 11 | 0 | 1 | 2 | 3 | 4 | 5 | 6 | 7 | 8 | 9 | 10 | 11 |
| 0 | 0,0 | 0,1 | 0,2 | 0,3 | 0,4 | 0,5 | 0,6 | 0,7 | 1,8 | 1,9 | 1,A | 1,B | 1,0 | 1,1 | 1,2 | 1,3 | 1,4 | 1,5 | 1,6 | 1,7 | 0,8 | 0,9 | 0,A | 0,B |
| 64 | 3,0 | 3,1 | 3,2 | 3,3 | 3,4 | 3,5 | 3,6 | 3,7 | 2,8 | 2,9 | 2,A | 2,B | 2,0 | 2,1 | 2,2 | 2,3 | 2,4 | 2,5 | 2,6 | 2,7 | 3,8 | 3,9 | 3,A | 3,B |
| 128 | 4,0 | 4,1 | 4,2 | 4,3 | 4,4 | 4,5 | 4,6 | 4,7 | 5,8 | 5,9 | 5,A | 5,B | 5,0 | 5,1 | 5,2 | 5,3 | 5,4 | 5,5 | 5,6 | 5,7 | 4,8 | 4,9 | 4,A | 4,B |
| 192 | 7,0 | 7,1 | 7,2 | 7,3 | 7,4 | 7,5 | 7,6 | 7,7 | 6,8 | 6,9 | 6,A | 6,B | 6,0 | 6,1 | 6,2 | 6,3 | 6,4 | 6,5 | 6,6 | 6,7 | 7,8 | 7,9 | 7,A | 7,B |

| | H | | | | | | | | | | | | | | | | | | | | | | |
|---|---|---|---|---|---|---|---|---|---|---|---|---|---|---|---|---|---|---|---|---|---|---|---|
| | 0 | 1 | 0 | 1 | 2 | 3 | 2 | 3 | 4 | 5 | 4 | 5 | 6 | 7 | 6 | 7 | 8 | 9 | 8 | 9 | 10 | 11 | 10 | 11 |
| V | L | | R | | L | | R | | L | | R | | L | | R | | L | | R | | L | | R | |
| 0 | 0,0 | 0,1 | 1,0 | 1,1 | 0,2 | 0,3 | 1,2 | 1,3 | 0,4 | 0,5 | 1,4 | 1,5 | 0,6 | 0,7 | 1,6 | 1,7 | 1,8 | 1,9 | 0,8 | 0,9 | 1,A | 1,B | 0,A | 0,B |
| 64 | 3,0 | 3,1 | 2,0 | 2,1 | 3,2 | 3,3 | 2,2 | 2,3 | 3,4 | 3,5 | 2,4 | 2,5 | 3,6 | 3,7 | 2,6 | 2,7 | 2,8 | 2,9 | 3,8 | 3,9 | 2,A | 2,B | 3,A | 3,B |
| 128 | 4,0 | 4,1 | 5,0 | 5,1 | 4,2 | 4,3 | 5,2 | 5,3 | 4,4 | 4,5 | 5,4 | 5,5 | 4,6 | 4,7 | 5,6 | 5,7 | 5,8 | 5,9 | 4,8 | 4,9 | 5,A | 5,B | 4,A | 4,B |
| 192 | 7,0 | 7,1 | 6,0 | 6,1 | 7,2 | 7,3 | 6,2 | 6,3 | 7,4 | 7,5 | 6,4 | 6,5 | 7,6 | 7,7 | 6,6 | 6,7 | 6,8 | 6,9 | 7,8 | 7,9 | 6,A | 6,B | 7,A | 7,B |

In the following TABLE 6G, example addresses for several line accesses are generally illustrated. In general, the start addresses (e.g., the gray column) in the left and right memories differ by one bit (e.g., binary 100). The same is generally true for the end addresses.

When four frame/field lines are stored together, each line (or row) may contain 4 frame lines (e.g., two frame lines in the left memory 142 and two frame lines in the right memory 144). In one example, the first four frame lines may be stored with the left memory 142 containing two even field lines and the right memory 144 containing two odd field lines. The

TABLE 6G

Line access. Left and right chips differ addresses differ by 8

| | Left chip | | | | Right chip | | | |
|---|---|---|---|---|---|---|---|---|
| Coordinates | Start | Binary | End | Binary | Start | Binary | End | Binary |
| 0,0–0,15 | 0 + 0 = 0 | | 0 + 7 = 7 | 111 | 0 + 8 = 8 | | 0 + 15 = 7 | 1111 |
| 0,16–0,31 | 0 + 16 = 16 | | 0 + 23 = 23 | 10111 | 0 + 24 = 24 | | 0 + 31 = 31 | 11111 |
| 1,0–1,15 | 0 + 8 = 8 | | 0 + 15 = 7 | 1111 | 0 + 0 = 0 | | 0 + 7 = 7 | 111 |
| 1,16–1,31 | 0 + 24 = 24 | | 0 + 31 = 31 | 11111 | 0 + 16 = 16 | | 0 + 23 = 23 | 10111 |

For the chrominance data in the same storage format, each two-byte pair generally contains one Cb value and one Cr value instead of horizontally adjacent pixels. As with the luminance data, a 2×8 region (e.g., 2×4 from each Cb and Cr component) may be transferred in a two-cycle burst (e.g., either frame, field or line, depending upon addressing mode). To cover a 3×3 region generally takes 2 to 4 bursts, depending on alignment (e.g., 4 to 8 cycles). In a worst case scenario (e.g., no pre-charging), 12 cycles may be used. However, a reasonable worst case transfer may have a time of about 7 cycles. As used herein, the term "reasonable worst case" generally refers to a time determined by ignoring statistically unlikely events and averaging the number of cycles over a few macroblocks.

Combined, luminance and chrominance motion compensation for a 4×4 block may take 32 cycles in the worst case scenario or 27 cycles for the reasonable worst case. The total cost for a macroblock may be 432 cycles for the reasonable worst case and 512 cycles for the worst case.

In another two memory embodiment of the present invention, four frame/field lines may be stored (or transferred) together. An example of such a storage scheme may be illustrated generally by the following TABLE 7:

next four frame lines may be placed with the even frame lines (e.g., top field) in the right memory 144 and the odd frame lines (e.g., bottom field) in the left memory 142. An example relationship between addresses and pixels may be summarized in the following TABLE 8:

TABLE 8

| | Left | | Right | |
|---|---|---|---|---|
| Address | Row | Col | Row | Col |
| 0 | 0 | 0 | 1 | 0 |
| 1 | 2 | 0 | 3 | 0 |
| 2 | 0 | 1 | 1 | 1 |
| 3 | 2 | 1 | 3 | 1 |
| ... | ... | ... | ... | ... |
| 62 | 0 | 31 | 1 | 31 |
| 63 | 2 | 31 | 3 | 31 |
| 64 | 5 | 0 | 4 | 0 |
| 65 | 7 | 0 | 6 | 0 |
| 66 | 5 | 1 | 4 | 1 |
| 67 | 7 | 1 | 6 | 1 |
| ... | ... | ... | ... | ... |
| 126 | 5 | 31 | 4 | 0 |
| 127 | 7 | 31 | 6 | 0 |
| 128 | 8 | 0 | 9 | 0 |
| 129 | 10 | 0 | 11 | 0 |
| 130 | 8 | 1 | 9 | 1 |
| 131 | 10 | 1 | 11 | 1 |

TABLE 7

| L | R | L | R | L | R | L | R | L | R | L | R |
|---|---|---|---|---|---|---|---|---|---|---|---|
| 0,0 | 2,0 | 1,0 | 3,0 | 0,1 | 2,1 | 1,1 | 3,1 | 0,2 | 2,2 | 1,2 | 3,2 |
| 5,0 | 7,0 | | | 5,1 | 7,1 | | | 5,2 | 7,2 | | |
| 8,0 | A,0 | 9,0 | B,0 | 8,1 | A,1 | 9,1 | B,1 | 8,2 | A,2 | 9,2 | B,2 |
| D,0 | F,0 | C,0 | E,0 | D,1 | F,1 | C,1 | E,1 | D,2 | F,2 | C,2 | E,2 |

| L | | R | | L | | R | | L | | R | |
|---|---|---|---|---|---|---|---|---|---|---|---|
| 0,3 | 2,3 | 1,1 | 3,1 | | | 1,4 | 3,4 | | | 1,5 | 3,5 |
| 5,3 | 7,3 | | | 5,4 | 7,4 | | | 5,5 | 7,5 | | |
| 8,3 | A,3 | 9,3 | B,3 | 8,4 | A,4 | 9,4 | B,4 | 8,5 | A,5 | 9,5 | B,5 |
| D,3 | F,3 | C,3 | E,3 | D,4 | F,4 | C,4 | E,4 | D,5 | F,5 | C,5 | E,5 |

In the frame reading mode, data may be read in each cycle by presenting the same address to each of the memories 142 and 144. In each half-cycle, a 4×1 block from the frame may be read. In a 2-cycle burst, a 4×4 block from the frame may be read. Three 2-cycle bursts generally cover a 4-row and 4-column aligned 4V×12H region of the frame. Such a region generally covers an arbitrary nine columns. Three such bursts generally cover a 4-row and 4-column aligned 12V×12H region of the frame. A 12V×12H region may cover an arbitrary nine columns and nine rows (e.g., reads any 9×9 block). An arbitrary 9×9 block may be read in 3*3=9 two-cycle bursts, or 18 cycles total.

In the field reading mode, for each half-cycle, the address presented to the right memory 144 is generally one line greater than the address presented to the left memory 142. Because the tile width is generally a power of two, the value of one address bit (or pin) is generally changed. For example, given a tile of width W, the addresses presented to each of the memories 142 and 144 may differ by 4W. In a single 2-cycle burst, a 2×4 region from each of the memories 142 and 144, or a 4×4 region in the field, may be transferred. Referring to TABLE 7, the light grey shaded values generally represent pixels transferred in a first burst and the dark grey shaded values generally represent pixels of a second burst for a total of 18 cycles.

In the present embodiment, each tile is generally divided into sub-tiles, where each sub-tile generally comprises 4 frame lines (e.g., two lines from each field). Similarly to the previous embodiment, when an address (or location) in the left memory holds field F, field row Y, line X, the same address (or location) in the right memory generally holds Field F', field row Y, line X, where F'=top if F=bottom and F'=bottom if F=top.

With the storage order presented in TABLE 7, a store or load operation for a single line generally uses only one of the memories 142 or 144. Even then, there are generally two lines intermingled. Penalties for capture or display may be avoided by either adding 3 line buffers in the display and capture units or by switching the role of the left memory 142 and the right memory 144 after a predetermined number of columns (e.g., every 8 columns) and adding a single line buffer to the display and capture units. Switching the roles of the memory 142 and 144, for example, every 8 columns generally takes a somewhat more complex addressing scheme. However, both of the memories 142 and 144 may be used to access a line-pair. The line-pair may be loaded or stored together, as shown in the following TABLE 9:

where the different shadings generally indicate different bursts.

Because each memory generally switches between rows every burst length, when accessing the same row in the left and right memories (e.g., for display or capture), the left and right memory addresses differ by the burst length. Since the burst length is generally a power of two, the addresses may be generated by complementing another address pin between the left and right memories. A detailed diagram in accordance with this embodiment is shown in FIG. 5B. In general, two address pins may differ between the left and right memories. In the frame mode (e.g., when addressing a block within a frame), the addresses sent to both memories are generally the same. In the field mode (e.g., when addressing a block within a field), one of the address pins generally differs. In the line mode (e.g., when addressing a line), a different one of the address pins generally differs.

Two chrominance lines may be stored together to provide a 2×4 region from each of the chrominance components Cb and Cr in a two-cycle burst. Alternatively, 4 lines may be stored together to provide a 4×2 region. In either case, the (reasonable) worst case cycle times may be (7) 12 cycles for chrominance, (25) 30 cycles for luminance and chrominance for a 4×4 block, and (400) 480 cycles for an entire macroblock.

When two chrominance lines are stored together, extra capture and display line buffers are generally used for luminance. However, it may be desirable to store 4 lines together to unify the luminance and chrominance designs. When two chrominance lines are stored together and 4 luminance lines are stored together, two address pins to the two memories 142 and 144 (e.g., one for luminance and one for chrominance) are generally duplicated.

While specific sized blocks have been described in the schemes described, other sized blocks may be used. A number of approaches to improve DMA performance may be summarized in the following TABLE 10.

TABLE 9

| L | | R | | L | | R | | L | | R | |
|---|---|---|---|---|---|---|---|---|---|---|---|
| ▓0,0▓ | ▓2,0▓ | 1,0 | 3,0 | ▓0,1▓ | ▓2,1▓ | 1,1 | 3,1 | ▓0,2▓ | ▓2,2▓ | 1,2 | 3,2 |
| 5,0 | 7,0 | ▓4,0▓ | ▓6,0▓ | 5,1 | 7,1 | ▓4,1▓ | ▓6,1▓ | 5,2 | 7,2 | ▓4,2▓ | ▓6,2▓ |
| 8,0 | A,0 | 9,0 | B,0 | 8,1 | A,1 | 9,1 | B,1 | 8,2 | A,2 | 9,2 | B,2 |
| D,0 | F,0 | C,0 | E,0 | D,1 | F,1 | C,1 | E,1 | D,2 | F,2 | C,2 | E,2 |

| L | | R | | L | | R | | L | | R | |
|---|---|---|---|---|---|---|---|---|---|---|---|
| ▓0,3▓ | ▓2,3▓ | 1,3 | 3,3 | 1,4 | 3,4 | ▓0,4▓ | ▓2,4▓ | 1,5 | 3,5 | ▓0,5▓ | ▓2,5▓ |
| 5,3 | 7,3 | ▓4,3▓ | ▓6,3▓ | ▓4,4▓ | ▓6,4▓ | 5,4 | 7,4 | ▓4,5▓ | ▓6,5▓ | 5,5 | 7,5 |
| 8,3 | A,3 | 9,3 | B,3 | 9,4 | B,4 | 8,4 | A,4 | 9,5 | B,5 | 8,5 | A,5 |
| D,3 | F,3 | C,3 | E,3 | C,4 | E,4 | D,4 | F,4 | C,5 | E,5 | D,5 | F,5 |

TABLE 10

Worst case motion compensation cycles

| mc size | | 2 field lines | 2 frame/ field lines | 4 frame/ field lines |
|---|---|---|---|---|
| 4 × 4 H.264, one direction | | | | |
| Luma | 9 × 9 | 36 | 20 | 18 |
| Chroma | 3 × 3 | 24 | 12 | 12 |
| Block | | 60 | 32 | 30 |
| Macroblock | | 960 | 512 | 480 |
| 8 × 8 H.264, bidirectional | | | | |
| Luma | 13 × 13 | 52 | 42 | 32 |
| Chroma | 5 × 5 | 24 | 12 | 12 |
| Block | | 76 | 54 | 44 |
| Macroblock | | 608 | 432 | 352 |
| 8 × 16 (field) MPEG2, bidirectional | | | | |
| Luma | 9 × 17 | 36 | 30 | 30 |
| Chroma | 5 × 9 | 24 | 24 | 20 |
| Block | | 60 | 54 | 50 |
| Macroblock | | 240 | 216 | 200 |

In general, the number of cycles (e.g., given in TABLE 10) and all of the cycle counts presented above generally depend on a particular model for the memories 142 and 144. For example, a granularity of two-cycle bursts is generally typical for DDR-II type memory. However, for DDR-I memory, a granularity of 1 cycle may be achieved. A 1-cycle burst may reduce the number of cycles needed for most cases. Although a pre-charge time of 12 cycles has been used, the actual pre-charge time generally depends on the particular memory chip used. The actual pre-charge time may be more than 12 cycles (e.g., which would lead to higher cycle counts) or less than 12 cycles (e.g., which would lead to lower cycle counts).

Although several storage formats have been described in detail with respect to motion compensation, the storage formats of the present invention may also be efficient when used for storing and loading data for other tasks used in video encoding and decoding. For example, in motion estimation, the present invention may provide improvements in window loads. Loading of aligned luminance-only frame data may be more efficient because both fields may come from the same page (e.g., pre-charges may not always overlap transfers when there is no chrominance data). In frame pictures, the performance of loading target (or current) data for motion estimation may be improved, as well as loading luminance data for mode decisions.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
a controller configured to divide a frame of image data into a plurality of tiles; and
a memory configured to store said plurality of tiles, wherein at least one of said plurality of tiles comprises data from both a first field and a second field of said frame and said image data in each of said plurality of tiles is stored as a plurality of rows such that each row comprises pixels from at least two lines of a respective tile.

2. The apparatus according to claim 1, wherein each of said plurality of tiles is divided into a plurality of sub-tiles, each of said sub-tiles comprising a plurality of lines of a respective tile.

3. The apparatus according to claim 2, wherein said plurality of lines comprises data from both said first and second fields.

4. The apparatus according to claim 1, wherein said apparatus comprises at least one of a video encoder, a video decoder, a video compressor, a video decompressor, a video CODEC.

5. A method for storing interlaced image data comprising the steps of:
dividing a frame of said image data comprising two fields into a plurality of tiles, wherein at least one of said plurality of tiles contains data from both fields; and
storing said plurality of tiles, wherein said image data in each of said plurality of tiles is stored as a plurality of rows such that each row comprises pixels from at least two lines of a respective tile.

6. The method according to claim 5, further comprising the steps of:
dividing at least one of said plurality of tiles into a plurality of sub-tiles, wherein each sub-tile comprises a plurality of lines of a respective tile.

7. The method according to claim 6, wherein at least one of said plurality of sub-tiles comprises data from only a first one of said two fields and at least one other of said plurality of sub-tiles comprises data from only a second one of said two fields.

8. The method according to claim 6, wherein at least one of said plurality of sub-tiles comprises data from both of said two fields.

9. The method according to claim 6, wherein the storage of image data in said plurality of tiles is alternated between line pairs from opposite fields of said image in two separate storage devices.

10. The method according to claim 9, wherein two lines of a field are stored together.

11. The method according to claim 10, wherein the storage of image data in said plurality of tiles is alternated between even and odd lines of said frame, two at a time, in two separate storage devices.

12. The method according to claim 11, wherein a sub-tile of one of said plurality of tiles comprises data from two lines in said tile of one of said fields.

13. A method for storing image data comprising the steps of:
dividing a frame of said image data into a plurality of tiles;
dividing at least one of said plurality of tiles into a plurality of sub-tiles, wherein each of said plurality of sub-tiles comprises pixels from two or more lines of a respective tiles; and
storing said image data as a plurality of rows, wherein said pixels of each sub-tile are stored as one of said plurality of rows.

14. The method according to claim 13, wherein at least one of said plurality of tiles comprises data from a first and a second field of said frame.

15. The method according to claim 13, further comprising the step of:
    alternating said pixels in each of said plurality of rows between line pairs of a respective one of said plurality of sub-tiles.

16. The method according to claim 13, wherein each sub-tile comprises 2 lines of a respective tile.

17. The method according to claim 13, wherein each sub-tile comprises 4 lines of a respective tile.

18. The method according to claim 13, wherein at least one sub-tile comprises data from a first and a second field of said frame.

19. The method according to claim 13, wherein:
    at least one of said sub-tiles comprises data from only a first field of said frame; and
    at least one other of said sub-tiles comprises data from only a second field of said frame.

20. A method for storing image data comprising the steps of:
    dividing a frame of said image data into a plurality of tiles;
    dividing at least one of said plurality of tiles into a plurality of rows, wherein each of said plurality of rows comprises pixels from two or more lines of a respective tile and said pixels in each of said rows alternate between line pairs of the respective tile; and
    storing said plurality of rows, wherein image data in each of said plurality of tiles is stored in a non-raster format.

* * * * *